(12) United States Patent
Wu et al.

(10) Patent No.: US 8,875,534 B2
(45) Date of Patent: *Nov. 4, 2014

(54) ELECTRONIC APPARATUS HAVING AN AIRFLOW REGULATING DEVICE

(71) Applicant: Wistron Corporation, New Taipei (TW)

(72) Inventors: Wen-Chin Wu, New Taipei (TW);
Chi-Sung Chang, New Taipei (TW);
Ming-Chih Chen, New Taipei (TW);
Sung-Yu Hsieh, New Taipei (TW)

(73) Assignee: Wistron Corporation, New Taipei (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/897,509

(22) Filed: May 20, 2013

(65) Prior Publication Data

US 2013/0252532 A1 Sep. 26, 2013

Related U.S. Application Data

(62) Division of application No. 12/428,111, filed on Apr. 22, 2009, now Pat. No. 8,464,961.

(30) Foreign Application Priority Data

Jun. 27, 2008 (TW) ................................ 97124345 A

(51) Int. Cl.
*H05K 7/20* (2006.01)
*F24F 7/00* (2006.01)

(52) U.S. Cl.
CPC ........ *H05K 7/20127* (2013.01); *H05K 7/20181* (2013.01); *H05K 7/20209* (2013.01); *F24F 7/00* (2013.01)
USPC ....... 62/259.2; 236/49.1; 236/49.3; 236/49.5; 361/690

(58) Field of Classification Search
USPC ...................... 62/259.2; 236/49.1, 49.3, 49.5; 361/679.46–679.54, 688–697; 248/225.21, 617
See application file for complete search history.

(56) References Cited

U.S. PATENT DOCUMENTS 5,375,038 A 12/1994 Hardt
5,460,010 A * 10/1995 Kobayashi et al. ............. 62/187
(Continued)

FOREIGN PATENT DOCUMENTS

CN 101615061 12/2009
JP 2006-128243 5/2006
(Continued)

OTHER PUBLICATIONS

Chinese Office Action for Chinese patent application No. 200810127933.1 mailed May 2, 2012. (English Translation.).

(Continued)

*Primary Examiner* — Cheryl J Tyler
*Assistant Examiner* — Jonathan Bradford
(74) *Attorney, Agent, or Firm* — Merchant & Gould P.C.

(57) ABSTRACT

An electronic apparatus includes a housing and an airflow regulating device. The housing defines an accommodating space therein, and an air inlet that places the accommodating space in fluid communication with the external environment. The airflow regulating device includes a cover panel for covering and uncovering the air inlet, and an actuating mechanism coupled to the cover panel and driving movement of the cover panel to adjust the degree of opening of the air inlet in response to a change in temperature in the accommodating space.

3 Claims, 14 Drawing Sheets

(56) References Cited

U.S. PATENT DOCUMENTS

| | | |
|---|---|---|
| 6,857,493 B2 | 2/2005 | Shupp et al. |
| 7,018,289 B2 * | 3/2006 | Heil et al. .................... 454/369 |
| 7,262,964 B1 | 8/2007 | Barsun |
| 2004/0228091 A1 | 11/2004 | Miyairi |
| 2006/0202045 A1 | 9/2006 | Liu |
| 2008/0024979 A1 | 1/2008 | Ye et al. |

FOREIGN PATENT DOCUMENTS

| | | |
|---|---|---|
| TW | M243705 | 9/2004 |
| TW | 1285079 | 8/2007 |
| TW | I285079 | 8/2007 |

OTHER PUBLICATIONS

Taiwan Search Report for corresponding TW Application No. 07124345 dated Dec. 21, 2010 (translation attached).

Taiwanese Office Action for Chinese patent application No. 101126307 mailed Apr. 25, 2014. (English Translation.).

* cited by examiner

ELECTRONIC APPARATUS HAVING AN AIRFLOW REGULATING DEVICE

CROSS-REFERENCE TO RELATED APPLICATION

This application is a divisional of U.S. Ser. No. 12/428,111 filed Apr. 22, 2009 which claims priority of Taiwanese application no. 097124345, filed on Jun. 27, 2008, and which applications are incorporated herein by reference. To the extent appropriate, a claim of priority is made to each of the above disclosed applications.

BACKGROUND OF THE INVENTION

1. Field of the Invention

The invention relates to an electronic apparatus, more particularly to an electronic apparatus including an airflow-regulating device.

2. Description of the Related Art

Electronic apparatuses, such as desktop computers, servers, etc., in addition to becoming increasingly powerful, are being designed to increasingly reduced weights and sizes. As a result, heat-dissipating modules for such electronic apparatuses must also be reduced in size accordingly. However, a smaller size for the heat-dissipating modules typically translates into a drop in the effectiveness of the same, which may lead to crashing and other failures of the electronic apparatuses.

There are various heat-dissipating techniques that are currently being employed to remedy this problem, such as increasing fan rotational speed of the heat-dissipating module, using a large cooling fan with a thin profile, and using a water-cooling system and heat pipes. However, each of these approaches has a disadvantage as follows:

1. With respect to increasing fan rotational speed, since the number of air inlets of the electronic apparatus is fixed, it is difficult to effectively increase the amount of air induced into the electronic apparatus by increasing fan rotational speed. In addition, when the cooling fan is rotated at a high speed, noise and vibrations are easily generated.

2. With respect to the use of a large cooling fan with a thin profile, the housing of the electronic apparatus in this case must be formed having a large air inlet. This adversely affects the appearance of the electronic apparatus and allows dust to be easily accumulated in the electronic apparatus.

3. With respect to using a water-cooling system and heat pipes, such an implementation significantly increases the overall cost of the electronic apparatus.

In order to increase the heat-dissipating efficiency of a notebook computer, a large air inlet may be formed in a bottom or side wall of the notebook computer for increasing air inflow into the same. However, this approach may result in the accumulation dust and other minute objects within the notebook computer.

SUMMARY OF THE INVENTION

Therefore, the object of the invention is to provide an electronic apparatus including an airflow regulating device that has a simple structure and that can effectively increase the amount of air inflow into a housing of the electronic apparatus, thereby enhancing heat-dissipating efficiency and reducing manufacturing costs of the electronic apparatus.

The solution to the aforesaid drawbacks associated with the prior art is realized through the use of the electronic apparatus of this invention as described below. The electronic apparatus includes a housing and an airflow regulating device.

The housing defines an accommodating space therein and an air inlet in fluid communication with the accommodating space. The airflow regulating device includes a cover panel for covering and uncovering the air inlet, and an actuating mechanism operable to drive movement of the cover panel to adjust the degree of opening of the air inlet in response to a change in the temperature in the accommodating space.

The solution to the aforesaid drawbacks is realized further through the use of a motor controller for controlling operation of the actuating mechanism to drive movement of the cover panel.

In the aforementioned electronic apparatus, the airflow regulating device further includes a temperature sensor, a keyboard controller, and a temperature-controlling circuit coupled to the temperature sensor, the keyboard controller, and the motor controller, the temperature sensor detecting the temperature in the accommodating space and generating a temperature detection value corresponding to the temperature in the accommodating space, the keyboard controller being configured with different temperature settings, the temperature-controlling circuit being operable to receive the temperature detection value from the temperature sensor, transmit the temperature detection value to the keyboard controller, and receive a corresponding set value of one of the temperature settings from the keyboard controller, the temperature-controlling circuit generating a driving voltage corresponding to the corresponding set value to control operation of the motor controller.

In the aforementioned electronic apparatus, the motor controller generates a control signal corresponding to the driving voltage so as to control operation of the actuating mechanism, such that the actuating mechanism controls the amount of movement of the cover panel according to the temperature in the accommodating space to thereby control the degree of opening of the air inlet.

In the aforementioned electronic apparatus, when the driving voltage generated by the temperature-controlling circuit corresponds to a preset value established in the motor controller, the motor controller generates a control signal to control operation of the actuating mechanism to drive movement of the cover panel and thereby open the air inlet.

In the aforementioned electronic apparatus, the cover panel is movably mounted to the housing, and the actuating mechanism includes a motor coupled electrically to the motor controller, a pinion connected to and driven by the motor, and a rack engaging the pinion so as to move the cover panel when the motor is actuated.

In the aforementioned electronic apparatus, the housing has a side wall that is formed with the air inlet, and a supporting bracket mounted inwardly from the air inlet, the supporting bracket being formed with an elongate guiding groove, the actuating mechanism further including a pair of linkages that cross and that are pivoted to each other, each of the linkages having a pivot end pivoted to the cover panel, and an insert end opposite to the pivot end and received slidably in the guiding groove, the rack being pivoted to the insert end of one of the linkages so as to drive sliding movement of the insert ends in the guiding groove.

In the aforementioned electronic apparatus, the housing has a side wall that is formed with the air inlet, and a supporting bracket mounted inwardly from the air inlet, the actuating mechanism further including a pair of linkages that are parallel to each other, each of the linkages having first and second pivot ends that are pivoted to the cover panel and the supporting bracket, respectively, one of the linkages being formed with an elongate guiding hole, the rack having a tongue protruding therefrom into and slidable along the guiding hole in the one of the linkages.

In the aforementioned electronic apparatus, the housing has a side wall that is formed with the air inlet, and a supporting bracket mounted inwardly from the air inlet, the supporting bracket being formed with a bracket thread hole, the actuating mechanism further including a driving gear connected to and driven by the motor to rotate, a driven gear engaging and driven by the driving gear to rotate, and a threaded rod connected to the cover panel and extending through and engaging threadedly the bracket thread hole, the driven gear being formed with a gear thread hole to which the threaded rod is engaged threadedly.

In the aforementioned electronic apparatus, the housing has a side wall that is formed with the air inlet, the cover panel being pivotably connected to the side wall, the actuating mechanism further including a connecting part provided on the cover panel and formed with an elongate guiding slot, the rack having a tongue protruding therefrom into and slidable along the guiding slot.

In the aforementioned electronic apparatus, the cover panel is pivotably connected to the housing and is provided with a first hook element, the actuating mechanism including a second hook element mounted on the housing and engaging releasably the first hook element, and an urging spring for urging the cover panel to move relative to the air inlet from the closed position to an open position.

In the aforementioned electronic apparatus, the actuating mechanism further includes an actuating switch coupled electrically to the motor controller and capable of driving the second hook element so as to disengage from the first hook element.

In the aforementioned electronic apparatus, the cover panel is pivotably connected to the housing and is provided with a first hook element, the actuating mechanism including a second hook element mounted on the housing and engaging releasably the first hook element, and an urging spring for urging the cover panel to move relative to the air inlet from the closed position to an open position, the second hook element being pressable to move in a direction to disengage the first hook element.

In the aforementioned electronic apparatus, the actuating mechanism further includes a mounting seat mounted on the housing and formed with a retaining hole, and a biasing spring received in the retaining hole, the second hook element extending into and through the retaining hole and having a hook end that engages releasably the first hook element, and a pressing end that is disposed opposite to the hook end, the biasing spring biasing the second hook element for restoring the second hook element to its original position.

In the aforementioned electronic apparatus, the housing has a side wall that is formed with the air inlet, and a supporting bracket mounted inwardly from the air inlet, the supporting bracket being formed with an elongate guiding groove, the actuating mechanism further including a pair of linkages that cross and that are pivoted to each other, each of the linkages having a pivot end pivoted to the cover panel, and an insert end opposite to the pivot end and received slidably in the guiding groove, the actuating mechanism further including a pair of torsion springs, each of which abuts against the linkages in such a manner to drive sliding movement of the insert ends of the linkages toward each other in the guiding groove.

In the aforementioned electronic apparatus, the housing has a side wall that is formed with the air inlet, and a support-ing bracket mounted inwardly from the air inlet, the actuating mechanism further including a pair of linkages that are parallel to each other, each of the linkages having first and second pivot ends that are pivoted to the cover panel and the supporting bracket, respectively, the actuating mechanism further including a pair of torsion springs, each of which abuts against a respective one of the linkages and the supporting bracket so as to drive swinging movement of the linkages when the second hook element is disengaged from the first hook element.

In the aforementioned electronic apparatus, the housing has a side wall that is formed with the air inlet, the cover panel being pivoted to the side wall, the actuating mechanism further including a spring-positioning seat mounted on an inner side of the side wall, the urging spring being in the form of a torsion spring that is secured to the spring-positioning seat and that abuts against the cover panel.

In the aforementioned electronic apparatus, the housing includes a bottom wall formed with the air inlet, the cover panel being formed with an elongate hole, the actuating mechanism including a motor coupled electrically to the motor controller, a pinion connected to and driven by the motor, and a rack engaged with the pinion, the rack having a tongue extending through and slidable along the elongate hole to control rotation of the cover panel.

In the aforementioned electronic apparatus, the housing includes a bottom wall formed with the air inlet, the cover panel being formed with an elongate hole, the actuating mechanism including an operating rod mounted in the housing and connected to the cover panel, the operating rod having a tongue extending through and slidable along the elongate hole to control rotation of the cover panel.

With the inclusion of the airflow regulating device in the electronic apparatus of the invention, the amount of air inflow into the accommodating space can be increased so as to enhance the heat-dissipating efficiency of the cooling fan. As a result, crashing and other problems due to poor heat dissipation may be avoided. Moreover, by realizing effective heat dissipation through the simple structural design of the airflow regulating device, the use of a heat-dissipating module that is high in cost and complicated in structure is unneeded, and manufacturing costs are reduced.

BRIEF DESCRIPTION OF THE DRAWINGS

Other features and advantages of the invention will become apparent in the following detailed description of the embodiments with reference to the accompanying drawings, of which.

DETAILED DESCRIPTION

Figure 1:
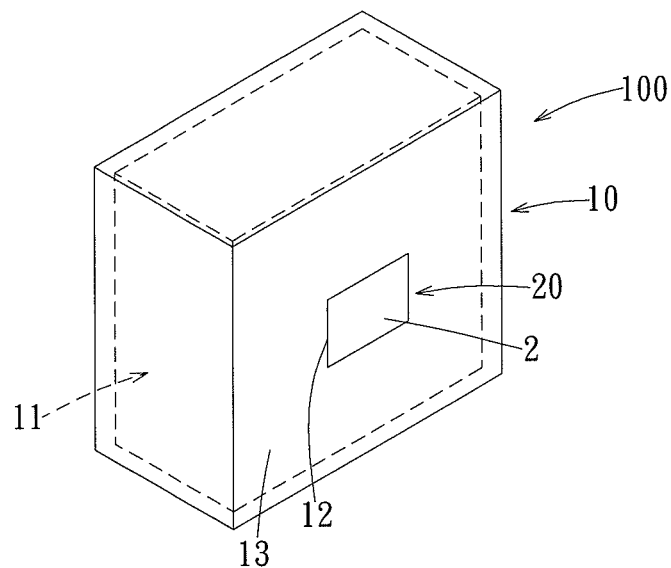
FIG. 1 is a perspective view of the first embodiment of an electronic apparatus according to the invention.

Before the invention is described in greater detail with reference to the accompanying embodiments, it should be noted herein that like elements are denoted by the same reference numerals throughout the disclosure.

Referring to FIG. 1, the first embodiment of an electronic apparatus 100 according to the invention is shown to include a housing 10 and an airflow regulating device 20. The housing 10 defines an accommodating space 11, and an air inlet 12 that places the accommodating space 11 in fluid communication with the external environment. The airflow regulating device 20 is used to adjust the degree of opening of the air inlet 12 so as to vary the amount of air inflow into the accommodating space 11. In this embodiment, the electronic apparatus 100 is a computer host or a server. However, in some embodiments, the electronic apparatus 100 may be a projector or any other type of electronic apparatus that generates a large amount of heat during operation and that requires a good heat-dissipating mechanism.

Figure 2:
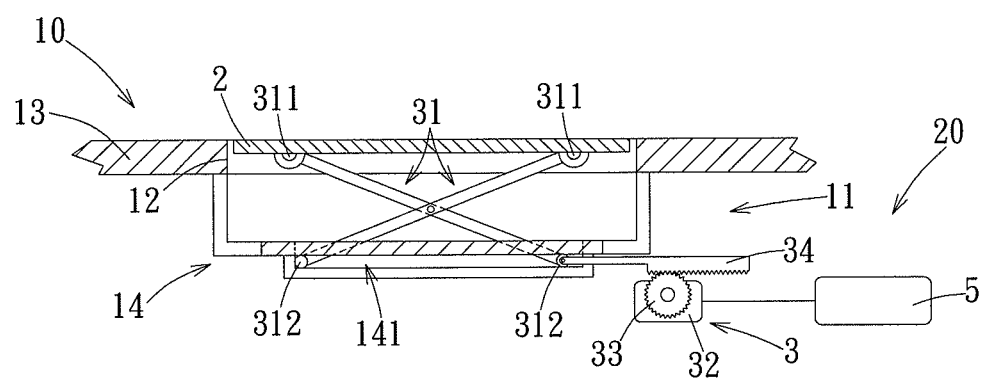
FIG. 2 is a fragmentary sectional view of the first embodiment, illustrating a state in which a cover panel of an airflow regulating device is disposed at a closed position.

As shown in FIGS. 1 and 2, the housing 10 has a side wall 13 that is formed with the air inlet 12, and a supporting bracket 14 mounted at an inner side of the side wall 13 and connected to the side wall 13. The airflow regulating device 20 includes a cover panel 2 for covering and uncovering the air inlet 12, and an actuating mechanism 3 operable to drive movement of the cover panel 2 to adjust the degree of opening of the air inlet 12. The supporting bracket 14 is formed with an elongate guiding groove 141. The actuating mechanism 3 further includes a pair of linkages 31 that cross and that are pivoted to each other. Each of the linkages 31 has a pivot end 311 pivoted to the cover panel 2, and an insert end 312 opposite to the pivot end 311 and received slidably in the guiding groove 141. The insert ends 312 of the two linkages 31 are slidable along the guiding groove 141 to move closer together or farther apart so as to move the cover panel 2 relative to the side wall 13. The actuating mechanism 3 further includes a motor 32 mounted in the accommodating space 11, a pinion 33 connected to and driven by the motor 32, and a rack 34 meshing with the pinion 33. As shown in FIG. 2, the rack 34 is disposed to the right of the guiding groove 141, and is connected pivotally to the insert end 312 of one of the linkages 31. As such, rotation of the pinion 33 results in movement of the rack 34, and the rack 34 causes the insert ends 312 of the linkages 31 to move along the guiding groove 141. Therefore, the rotational angle between the linkages 31 may be controlled to vary movement of the cover panel 2 relative to the air inlet 12, and ultimately adjust the opening degree of the air inlet 12.

Figure 3:
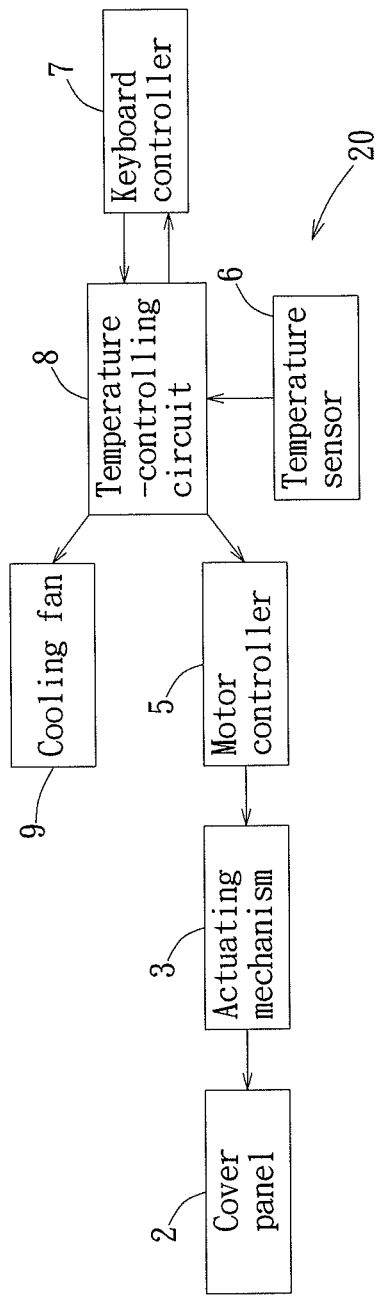
FIG. 3 is a circuit block diagram of the airflow regulating device of the first embodiment.

FIG. 3 shows a block diagram of the airflow regulating device 20. As shown in FIG. 3, in combination with FIG. 2, the airflow regulating device further includes a motor controller 5 coupled electrically to the motor 32 of the actuating mechanism 3, a temperature sensor 6, a keyboard controller 7, and a temperature-controlling circuit 8 coupled to the temperature sensor 6, the keyboard controller 7, and the motor controller 5. The temperature sensor 6 is used to detect the temperature in a specific area (such as a specific region or a specific electronic component) of the accommodating space 11. In this embodiment, an example is provided in which the temperature sensor 6 is used to detect the temperature of a central processing unit (CPU) (not shown). The motor controller 5 includes a driving circuit for controlling operation of the motor 32 of the actuating mechanism 3. The temperature sensor 6 generates different temperature detection values corresponding to temperature changes generated during operation of the CPU, and transmits each of the temperature detection values to the temperature-controlling circuit 8. The temperature-controlling circuit 8 then transmits the different temperature detection values to the keyboard controller 7, and the keyboard controller 7 feeds back a corresponding set value to the temperature-controlling circuit 8, such that the temperature-controlling circuit 8 generates a corresponding driving voltage according to the corresponding set value. The temperature-controlling circuit 8 then transmits the driving voltage to a cooling fan 9 and the motor controller 5. Therefore, the cooling fan 9 may be rotated at different speeds according to the different temperatures of the CPU to thereby dissipate heat from the same. Further, the motor controller 5 generates a control signal for controlling operation of the motor 32 of the actuating mechanism 3 according to the driving voltage, such that the motor 32 and the pinion 33 are able to move the rack 34 by different distances according to differences in the control signal, thereby adjusting the opening degree of the air inlet 12.

Figure 4:
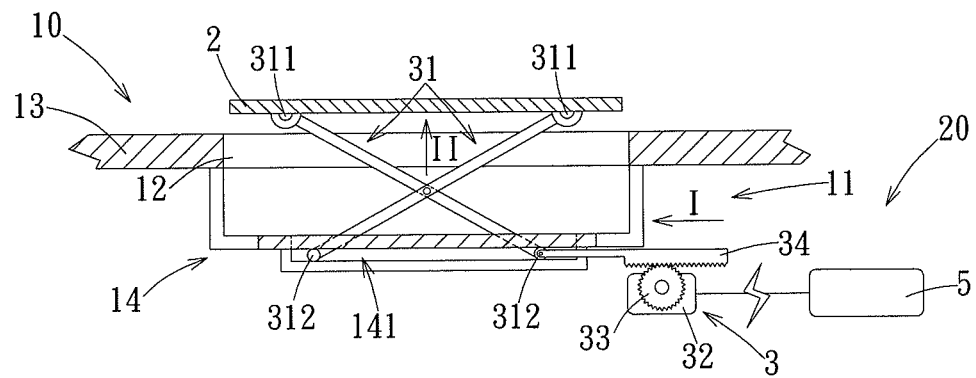
FIG. 4 is a fragmentary sectional view of the first embodiment, illustrating a state in which the cover panel of the airflow regulating device is disposed at a first open position.
Figure 5:
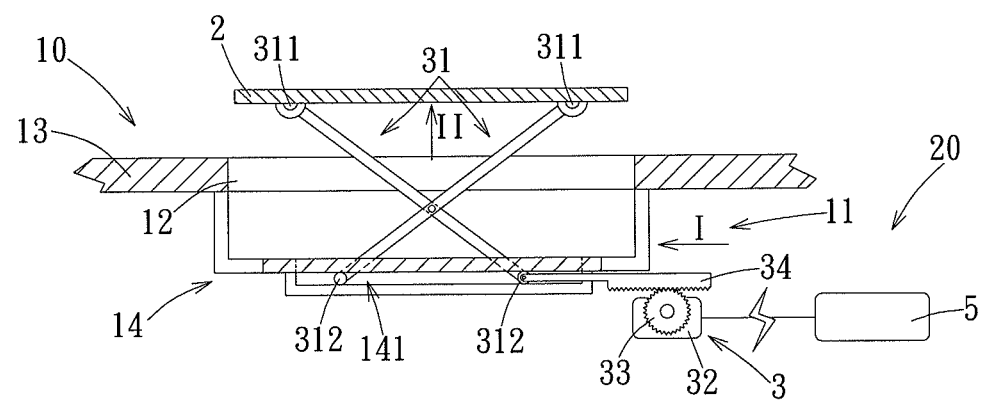
FIG. 5 is a fragmentary sectional view of the first embodiment, illustrating a state in which the cover panel of the airflow regulating device is disposed at a second open position.

In greater detail, when the temperature sensor 6 detects a temperature of the CPU of, for instance, 50 degrees, the keyboard controller 7 performs feedback of a corresponding set value, such that the temperature-controlling circuit 8 generates a driving voltage of, for instance, 3.5V for controlling rotational speed of the cooling fan 9 and simultaneously the operation of the motor controller 5. At this time, the motor controller 5 does not operate the motor 32 so that the cover panel 2 remains in a closed position as shown in FIG. 2, and the cooling fan 9 draws air from outside the housing 10 into the accommodating space 11 through air inlet ports (not shown) formed in another part of the housing 10 so as to cool the CPU. As shown in FIGS. 3 to 5, when the temperature sensor 6 detects an increase in the temperature of the CPU to, for instance, 60 degrees, the keyboard controller 7 performs feedback of a corresponding set value to the temperature-controlling circuit 8 so that the temperature-controlling circuit 8 generates a driving voltage of, for instance, 4V, to increase the rotational speed of the cooling fan 9 and simultaneously control operation of the motor controller 5. The motor controller 5 generates a control signal to control operation of the motor 32 such that the rack 34 is driven in a first direction (I) to move the insert end 312 of one of the linkages 31. Since the pivot end 311 of the other linkage 31 is pivotally connected to the cover panel 2 and the insert end 312 thereof is limited to move within the guiding groove 141, and the two linkages 31 are pivoted to each other, when the rack 34 drives one of the insert ends 312, this causes the two linkages 31 to drive the cover panel 2 in a second direction (II) to a first open position as shown in FIG. 4, thereby resulting in an increase in the opening degree of the air inlet 12 and an increase in the amount of air inflow into the accommodating space 11 for cooling the CPU. Subsequently, when the temperature sensor 6 detects an increase in the temperature of the CPU to, for instance, 70 degrees, the keyboard controller 7 performs feedback of a corresponding set value to the temperature-controlling circuit 8 so that the temperature-controlling circuit 8 generates a driving voltage of, for instance, 4.5V, to increase the rotational speed of the cooling fan 9 and simultaneously operate the motor controller 5. The motor controller 5 generates a control signal to control operation of the motor 32 such that the rack 34 is further driven by the motor 32 in the first direction (I) so as to move the insert ends 312 of the linkages 31 further toward each other and to move the cover panel 2 further in the second direction (II) from the first open position to a second open position as shown in FIG. 5, thereby further increasing the opening degree of the air inlet 12 and the amount of air inflow into the accommodating space 11.

With the increase in the rotational speed of the cooling fan 9 and in the opening degree of the air inlet 12, the heat-dissipating efficiency of the cooling fan 9 is enhanced, and crashing of the electronic apparatus 100 due to poor heat dissipation can be avoided. Moreover, with the inclusion of the airflow regulating device 20, which has a relatively simple structure, in the electronic apparatus 100 of this invention, the use of a heat-dissipating module that is high in cost and complicated in structure is avoided. As such, the manufacturing costs of the electronic apparatus 100 can be significantly reduced. Furthermore, since the airflow regulating device 20 is disposed in the housing 10 and since an outer surface of the cover panel 2 of the airflow regulating device 20 is flush with an outer surface of the side wall 13 of the housing 10 when the cover panel 2 is disposed at the closed position, the appearance of the electronic apparatus 100 is not adversely affected by the airflow regulating device 20.

It is to be noted that while an example is given in this embodiment in which the temperature of the CPU slowly increases, in actual operation, the temperature of the CPU may fluctuate higher and lower. Therefore, the motor 32 is able to move the rack 34 in the first direction (I) or in a direction opposite to the first direction (I) such that the opening degree of the air inlet 12 may be controlled in accordance with the operating temperature of the CPU. In addition, although the temperature sensor 6 is described as detecting only three temperatures of the CPU of 50, 60, and 70 degrees, and the temperature-controlling circuit 8 is described as generating three corresponding voltage values, in practice, the temperature sensor 6 may detect higher or lower temperatures. Hence, the detected values and corresponding voltages may be varied as needed, and the movement of the cover panel 2 may be varied in a greater number of states. The invention is not limited to the embodiment disclosed above.

Figure 6:
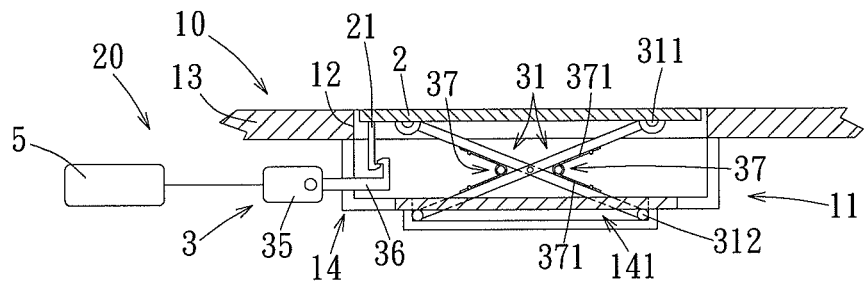
FIG. 6 is a fragmentary sectional view of the second embodiment of an electronic apparatus according to the invention, illustrating a state in which a cover panel of an airflow regulating device is disposed at a closed position, and first and second hook elements are disposed at engaging positions.
Figure 7:
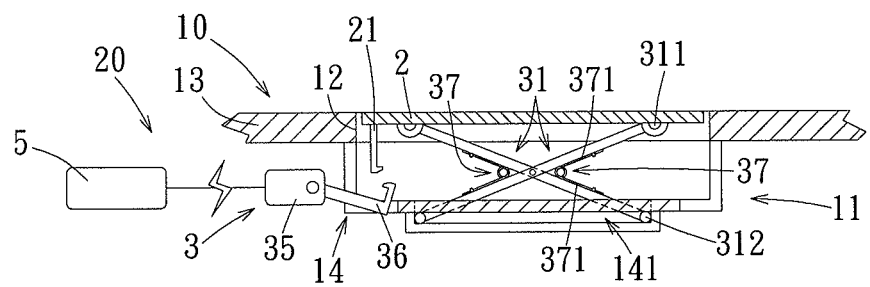
FIG. 7 is a fragmentary sectional view of the second embodiment, illustrating a state in which the cover panel of the airflow regulating device is disposed at the closed position, the first hook element is disposed at the engaging position, and the second hook element is disposed at a disengaging position.
Figure 8:
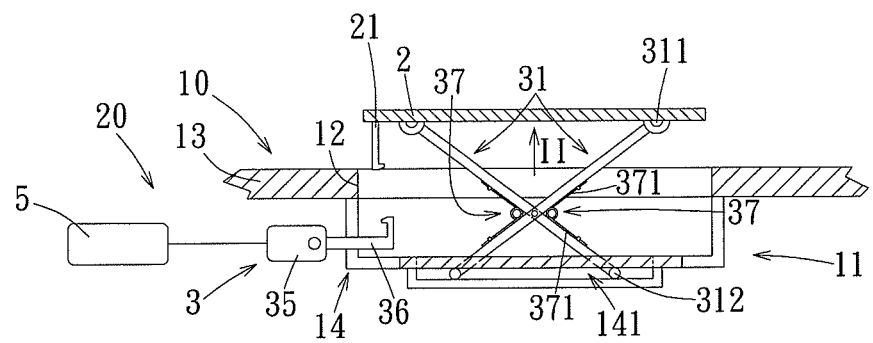
FIG. 8 is a fragmentary sectional view of the second embodiment, illustrating a state in which the cover panel of the airflow regulating device is disposed at an open position, the first hook element is disposed at a disengaging position, and the second hook element is disposed at the engaging position.

FIGS. 6 to 8 illustrate the second embodiment of the electronic apparatus 100 of this invention. The connection between the cover panel 2 and the supporting bracket 14 of the second embodiment is similar to that of the previous embodiment. However, the design and the operation of the actuating mechanism 3 of the second embodiment are different from those of the previous embodiment.

In the second embodiment, an inner side of the cover panel 2 is provided with a first hook element 21. The actuating mechanism 3 further includes an actuating switch 35 coupled electrically to the motor controller 5, a second hook element 36 connected pivotably to the actuating switch 35 and engaging releasably the first hook element 21, and a pair of urging springs 37. Each of the urging springs 37 is a torsion spring, and has two opposite spring arms 371 abutting against the linkages 31, respectively, so as to provide an urging force in a manner to drive sliding movement of the insert ends 312 of the linkages 31 in the guiding groove 141 and thereby to urge the cover panel 2 to move relative to the air inlet 12 from the closed position to an open position. In this embodiment, the motor controller 5 is a control device that is configured such that when one of the driving voltage values generated by the temperature-controlling circuit 8 (see FIG. 3) corresponds to a preset value established in the motor controller 5, the motor controller 5 generates a control signal to actuate the actuating switch 35 to drive pivotal movement of the second hook element 36 to disengage from the first hook element 21, thereby permitting pivotal movement of the linkages 31 relative to each other and movement of the cover panel 2 relative to the air inlet 12 from the closed position (see FIG. 6) to the open position (see FIG. 8) through the urging force of the urging springs 37 urging against the linkages 31. It is to be noted that the preset values of the motor controller 5 can be established to values, such as 3.5V, 4V, 4.5V, or other values based on actual requirements.

Figure 9:
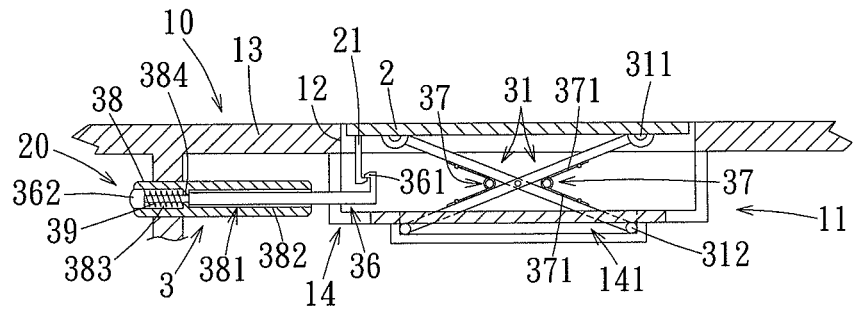
FIG. 9 is a fragmentary sectional view of the third embodiment of an electronic apparatus according to the invention, illustrating a state in which a cover panel of an airflow regulating device is disposed at a closed position, and first and second hook elements are disposed at engaging positions.
Figure 10:
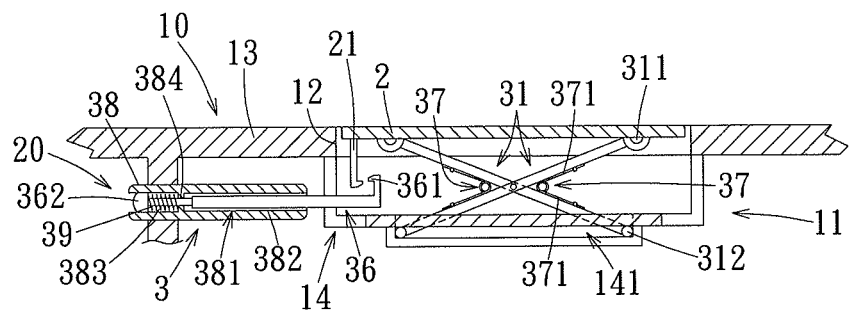
FIG. 10 is a fragmentary sectional view of the third embodiment, illustrating a state in which the cover panel of the airflow regulating device is disposed at the closed position, the first hook element is disposed at the engaging position, and the second hook element is disposed at a disengaging position.
Figure 11:
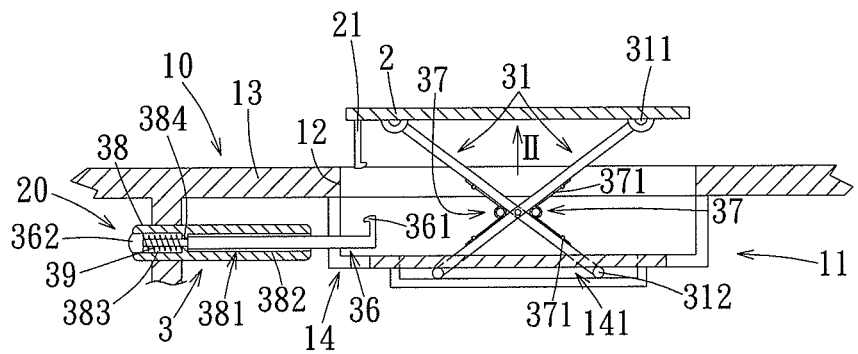
FIG. 11 is a fragmentary sectional view of the third embodiment, illustrating a state in which the cover panel of the airflow regulating device is disposed at an open position, the first hook element is disposed at a disengaging position, and the second hook element is disposed at the engaging position.

FIGS. 9 to 11 illustrate the third embodiment of the electronic apparatus 100 of this invention. The connection between the cover panel 2 and the supporting bracket 14 of the third embodiment is similar to that in the second embodiment. However, the design and the operation of the actuating mechanism 3 of the third embodiment are different from those of the previous embodiments.

In the third embodiment, the actuating mechanism 3 further includes a mounting seat 38 mounted on the housing 10 and formed with a retaining hole 381, and a biasing spring 39. The mounting seat 38 further includes a partition plate 384 dividing the retaining hole 381 into first and second retaining sections 382, 383. The biasing spring 39 is disposed in the second retaining section 383. The second hook element 36 extends into and through the first and second retaining sections 382, 383 and the biasing spring 39, and has a hook end 361 that engages releasably the first hook element 21, and a pressing end 362 that is disposed opposite to the hook end 361 and that extends outwardly through the second retaining section 383. The second hook element 36 is pressable to move from an engaging position (see FIG. 9) to a disengaging position (see FIG. 10) so as to permit movement of the first hook element 21 together with the cover panel 2 from an engaging position (see FIG. 10) to a disengaging position (see FIG. 11). In this embodiment, the biasing spring 39 is a compression spring, and provides a biasing force between the partition plate 384 and the pressing end 362 of the second hook element 36 for restoring the second hook element 36 from the disengaging position to its original position, i.e., the engaging position.

In operation, when the pressing end 362 of the second hook element 36 is pressed through driving means (not shown) in response to a temperature change in the accommodating space 11 so as to drive the second hook element 36 to disengage from the first hook element 21 to release the cover panel 2, the urging force of the urging springs 37 then urges the linkages 31 to pivot relative to each other to move the cover panel 2 from a closed position (see FIG. 10) to an open position (see FIG. 11). In some embodiments, the hook element 36 may be manually operated by a user to disengage from the first hook element 21.

Figure 12:
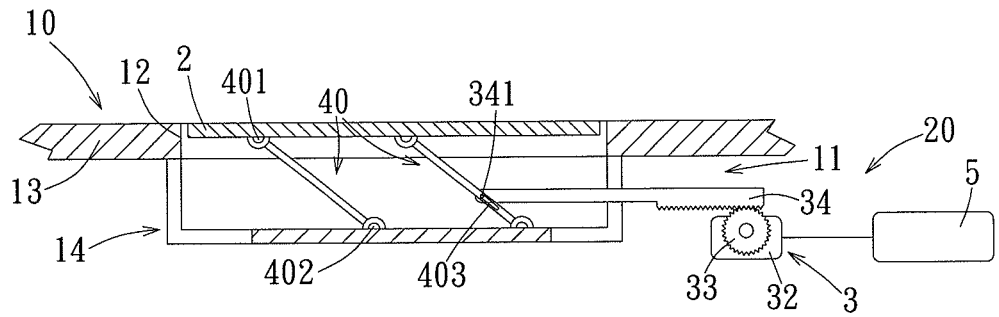
FIG. 12 is a fragmentary sectional view of the fourth embodiment of an electronic apparatus according to the invention, illustrating a state in which a cover panel of an airflow regulating device is disposed at a closed position.

FIG. 12 illustrates the fourth embodiment of the electronic apparatus 100 according to this invention. The manner in which the motor controller 5 controls the motor 32 of the fourth embodiment is similar to that of the first embodiment. However, the connection between the cover panel 2 and the supporting bracket 14 of the fourth embodiment is different from that of the first embodiment.

Figure 13:
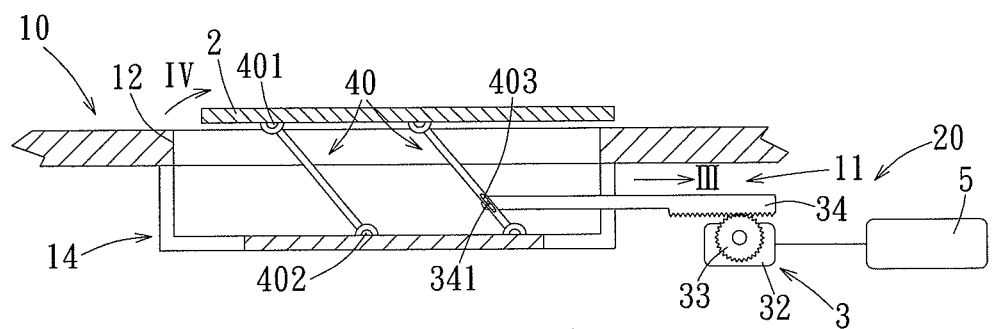
FIG. 13 is a fragmentary sectional view of the fourth embodiment, illustrating a state in which the cover panel of the airflow regulating device is disposed at a first open position.
Figure 14:
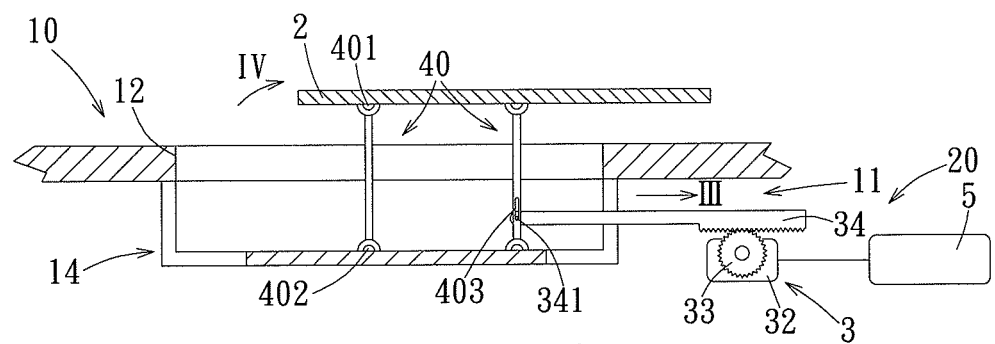
FIG. 14 is a fragmentary sectional view of the fourth embodiment, illustrating a state in which the cover panel of the airflow regulating device is disposed at a second open position.

In the fourth embodiment, the actuating mechanism 3 includes a pair of linkages 40 that are parallel to each other, and that extend a direction different from and form an angle with the cover panel 2. Each of the linkages 40 has first and second pivot ends 401, 402 that are pivoted to the cover panel 2 and the supporting bracket 14, respectively. One of the linkages 40 disposed adjacent to the rack 34 is formed with an elongate guiding hole 403. The rack 34 has a tongue 341 protruding therefrom into and slidable along the guiding hole 403 in said one of the linkages 40. When the temperature sensor 6 (see FIG. 3) detects a CPU temperature of, for instance, 50 degrees, the motor controller 5 performs control such that the motor 32 is not operated, so that the cover panel 2 remains at its original position, i.e., a closed position as shown in FIG. 12. At this time, the tongue 341 of the rack 34 is disposed at a top end of the guiding hole 403. When the temperature sensor 6 subsequently detects a CPU temperature of, for instance, 60 degrees, the motor controller 5 controls the motor 32 to drive the rack 34 to move in a direction (III) so as to drive swinging movement of the linkages 40 and movement of the cover panel 2 along a curved direction (IV) to a first open position as shown in FIG. 13. At this time, the tongue 341 of the rack 34 is disposed at a central location of the guiding hole 403. When the temperature sensor 6 subsequently detects a CPU temperature of, for instance, 70 degrees, the motor controller 5 controls the motor 32 to drive the rack 34 to move further in the direction (III) so as to drive swinging movement of the linkages 40 and movement of the cover panel 2 further along the curved direction (IV) from the first open position to a second open position as shown in FIG. 14. At this time, the tongue 341 of the rack 34 is disposed at a bottom end of the guiding hole 403.

Figure 15:
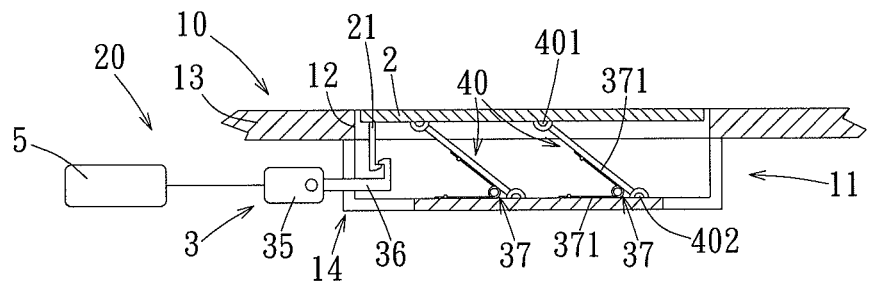
FIG. 15 is a fragmentary sectional view of the fifth embodiment of an electronic apparatus according to the invention, illustrating a state in which a cover panel of an airflow regulating device is disposed at a closed position, and first and second hook elements are disposed at engaging positions.
Figure 16:
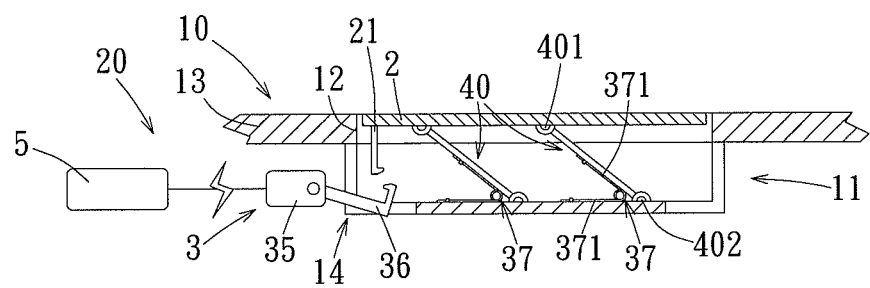
FIG. 16 is a fragmentary sectional view of the fifth embodiment, illustrating a state in which the cover panel of the airflow regulating device is disposed at the closed position, the first hook element is disposed at the engaging position, and the second hook element is disposed at a disengaging position.
Figure 17:
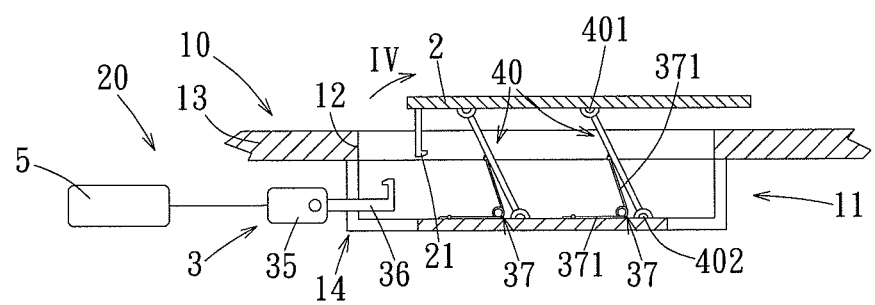
FIG. 17 is a fragmentary sectional view of the fifth embodiment, illustrating a state in which the cover panel of the airflow regulating device is disposed at an open position, the first hook element is disposed at a disengaging position, and the second hook element is disposed at the engaging position.

FIGS. 15 to 17 illustrate the fifth embodiment of the electronic apparatus 100 according to this invention. The manner in which the motor controller 5 controls the actuating switch 35 of the actuating mechanism 3 of the fifth embodiment is similar to that of the second embodiment, and the connection between the cover panel 2 and the supporting bracket 14 of the fifth embodiment is similar to that of the fourth embodiment. However, in the fifth embodiment, the urging springs 37 of the actuating mechanism 3 are disposed at positions different from those of the urging springs 37 of the second embodiment. In this embodiment, the spring arms 317 of each of the urging springs 37 abut against a respective one of the linkages 40 and the supporting bracket 14, respectively. As such, when the second hook element 36 is disengaged from the first hook element 21 to release the cover panel 2, the urging force of the urging springs 37 causes the linkages 40 to swing so as to move the cover panel 2 from a closed position (see FIG. 16) to an open position (see FIG. 17).

Figure 18:
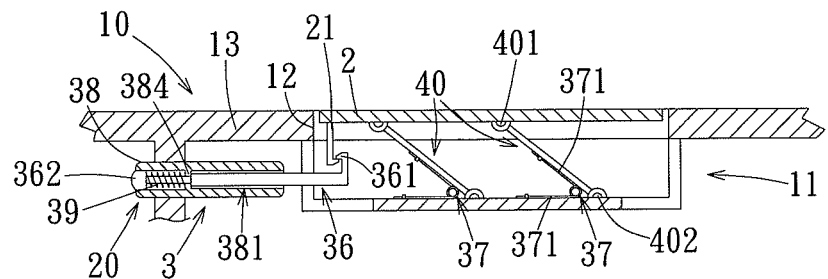
FIG. 18 is a fragmentary sectional view of the sixth embodiment of an electronic apparatus according to the invention, illustrating a state in which a cover panel of an airflow regulating device is disposed at a closed position, and first and second hook elements are disposed at engaging positions.
Figure 19:
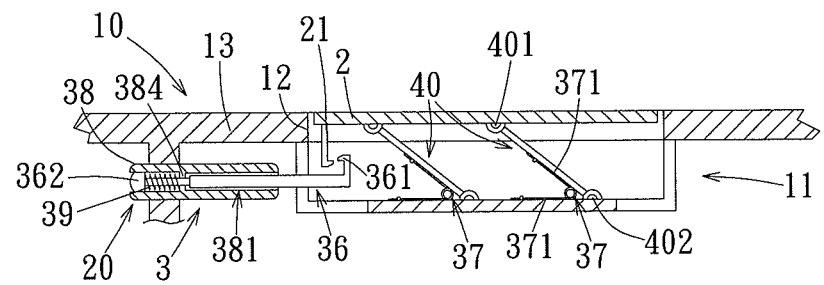
FIG. 19 is a fragmentary sectional view of the sixth embodiment, illustrating a state in which the cover panel of the airflow regulating device is disposed at the closed position, the first hook element is disposed at the engaging position, and the second hook element is disposed at a disengaging position.
Figure 20:
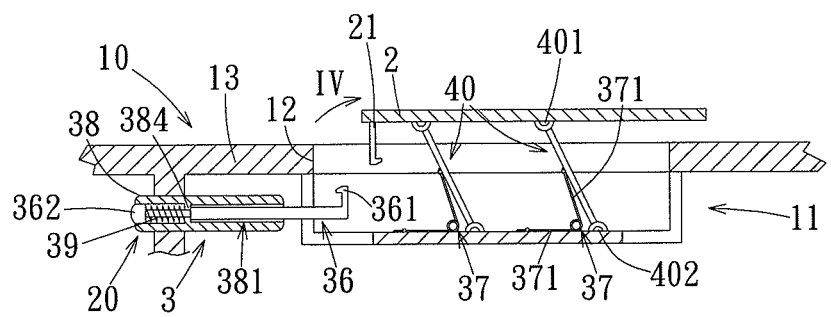
FIG. 20 is a fragmentary sectional view of the sixth embodiment, illustrating a state in which the cover panel of the airflow regulating device is disposed at an open position, the first hook element is disposed at a disengaging position, and the second hook element is disposed at the engaging position.

FIGS. 18 to 20 illustrate the sixth embodiment of the electronic apparatus 100 according to this invention. The manner in which the second hook element 36 of the actuating mechanism 3 of the sixth embodiment operates is similar to that of the third embodiment, and the connection between the cover panel 2 and the supporting bracket 14 of the sixth embodiment is similar to that of the fifth embodiment. In operation, when the pressing end 362 of the second hook element 36 is operated such that the hook end 361 thereof disengages from the first hook element 21, the urging force of the urging springs 37 urges the linkages 40 to pivot so as to move the cover panel 2 from a closed position (see FIG. 19) to an open position (see FIG. 20).

Figure 21:
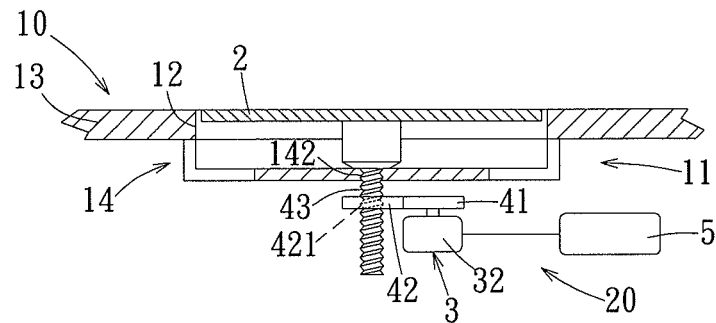
FIG. 21 is a fragmentary sectional view of the seventh embodiment of an electronic apparatus according to the invention, illustrating a state in which a cover panel of an airflow regulating device is disposed at a closed position.

FIG. 21 illustrates the seventh embodiment of the electronic apparatus 100 according to this invention. The manner in which the motor controller 5 controls the motor 32 of the seventh embodiment is similar to that of the first embodiment. However, the design and operation of the actuating mechanism 3 of the seventh embodiment are different from those of the first embodiment.

Figure 22:
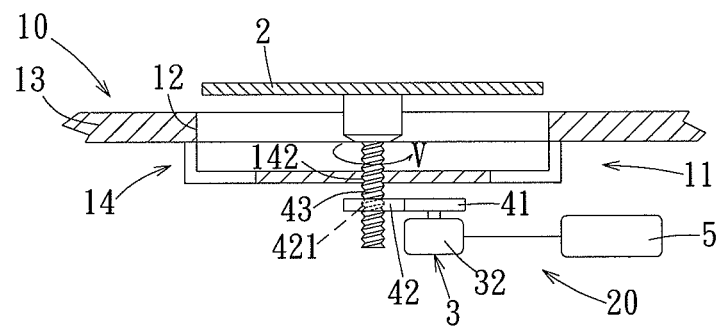
FIG. 22 is a fragmentary sectional view of the seventh embodiment, illustrating a state in which the cover panel of the airflow regulating device is disposed at a first open position.
Figure 23:
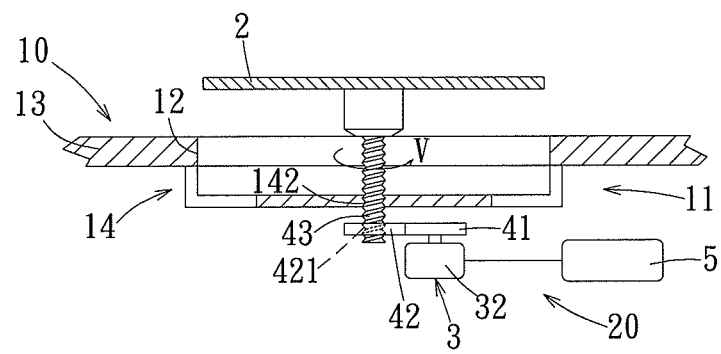
FIG. 23 is a fragmentary sectional view of the seventh embodiment, illustrating a state in which the cover panel of the airflow regulating device is disposed at a second open position.

In this embodiment, the supporting bracket 14 is formed with a bracket thread hole 142. The actuating mechanism 3 includes a driving gear 41 connected to and driven by the motor 32 to rotate, a driven gear 42 engaging and driven by the driving gear 41 to rotate relative to the housing 10 and formed with a gear thread hole 421, and a threaded rod 43 disposed in the housing 10, connected to the cover panel 2, and extending through and engaging threadedly the bracket thread hole 142 in the supporting bracket 14. The threaded rod 43 further extends through and engages threadedly the gear thread hole 421 in the driven gear 42. When the temperature sensor 6 (see FIG. 3) detects a CPU temperature of, for instance, 50 degrees, the motor controller 5 performs control such that the motor 32 is not activated, thereby maintaining the cover panel 2 at a closed position (see FIG. 21). When the temperature sensor 6 subsequently detects a CPU temperature of, for instance, 60 degrees, the motor controller 5 controls the motor 32 to rotate the driving gear 41, which, in turn, rotates the driven gear 42. This causes simultaneous rotation of the threaded rod 43 along a rotational direction (V) and axial movement of the threaded rod 43 along the axis thereof, which, in turn, causes movement of the cover panel 2 to a first open position (see FIG. 22). When the temperature sensor 6 subsequently detects a CPU temperature of, for instance, 70 degrees, the motor controller 5 controls the motor 32 to cause rotation of the driving gear 41, rotation of the driven gear 42, rotational movement of the threaded rod 43 along the rotational direction (V), axial movement of the threaded rod 43, and axial movement of the cover panel 2 from the first open position to a second open position (see FIG. 23).

Figure 24:
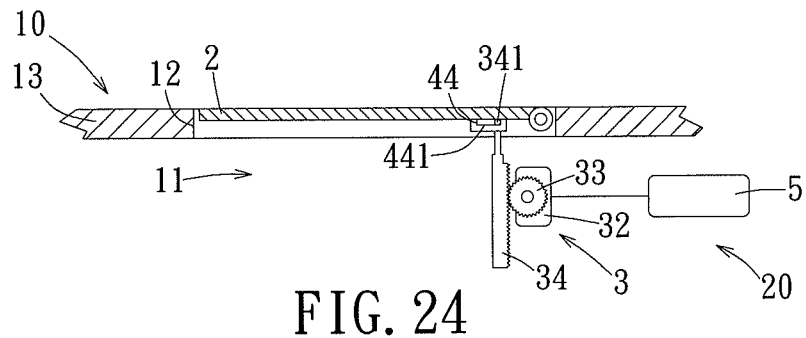
FIG. 24 is a fragmentary sectional view of the eighth embodiment of an electronic apparatus according to the invention, illustrating a state in which a cover panel of an airflow regulating device is disposed at a closed position.

FIG. 24 illustrates the eighth embodiment of the electronic apparatus 100 according to this invention. The manner in which the motor controller 5 controls the motor 32 is similar to that of the first embodiment. However, in this embodiment, the supporting bracket 14 is dispensed with and the cover panel 2 is connected to the side wall 13 of the housing 10 in a manner different from that of the cover panel 2 to the supporting bracket 14 of the first embodiment.

Figure 25:
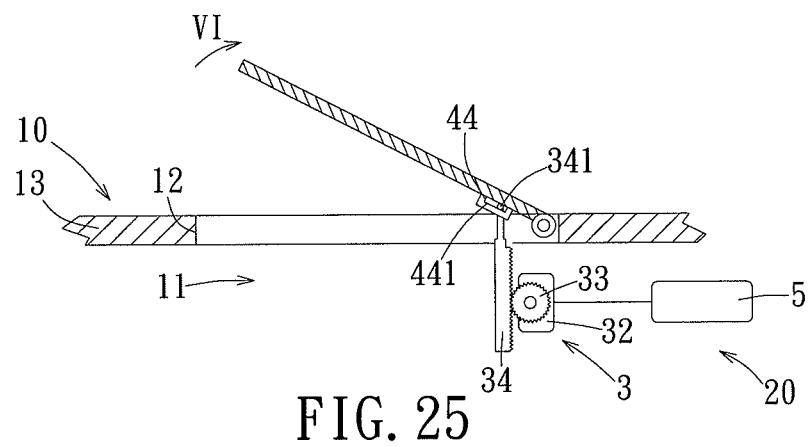
FIG. 25 is a fragmentary sectional view of the eighth embodiment, illustrating a state in which the cover panel of the airflow regulating device is disposed at a first open position.
Figure 26:
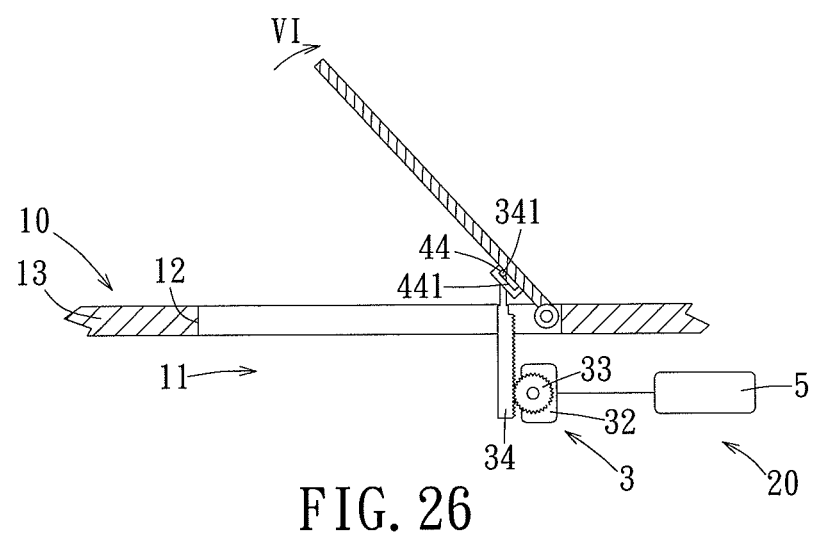
FIG. 26 is a fragmentary sectional view of the eighth embodiment, illustrating a state in which the cover panel of the airflow regulating device is disposed at a second open position.

In this embodiment, the cover panel 2 is pivoted to a periphery of the air inlet 12 in the side wall 13 of the housing 10. The actuating mechanism 3 further includes a connecting part 44 provided on the cover panel 2 adjacent to where the cover panel 2 pivots and formed with an elongate guiding slot 441. The rack 34 has a tongue 341 protruding therefrom into the guiding slot 441 and slidable along the guiding slot 441. When the temperature sensor 6 (see FIG. 3) detects a CPU temperature of, for instance, 50 degrees, the motor controller 5 controls the motor 32 so that the motor 32 is not activated, such that the cover panel 2 remains at a closed position (see FIG. 24) covering the air inlet 12. At this time, the tongue 341 of the rack 34 is disposed adjacent to a right end of the guiding slot 441. When the temperature sensor 6 subsequently detects a CPU temperature of, for instance, 60 degrees, the motor controller 5 controls the motor 32 to drive movement of the rack 34 in a vertical direction as well as sliding movement of the tongue 341 along the guide slot 441 so as to cause rotation of the cover panel 2 in a rotational direction (VI) to a first open position (see FIG. 25). At this time, the tongue 341 of the rack 34 is disposed at a position adjacent to a central point of the guiding slot 441. When the temperature sensor 6 subsequently detects a CPU temperature of, for instance, 70 degrees, the motor controller 5 controls the motor 32 to cause further movement of the rack 34 and movement of the tongue 341 along the guiding slot 441, such that the cover panel 2 rotates in the rotational direction (VI) from the first open position to a second open position (see FIG. 26). At this time, the tongue 341 of the rack 34 is disposed at a left end of the guiding slot 441.

Figure 27:
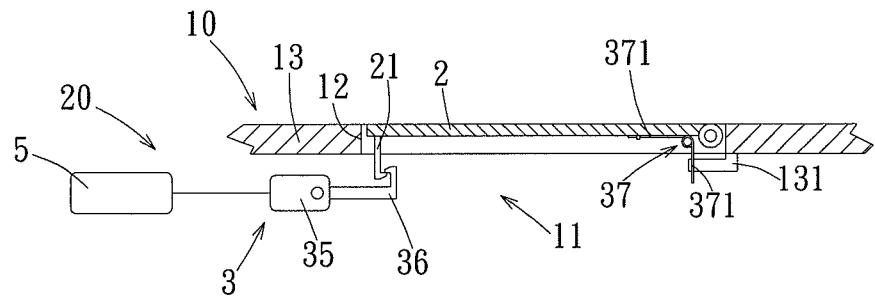
FIG. 27 is a fragmentary sectional view of the ninth embodiment of an electronic apparatus according to the invention, illustrating a state in which a cover panel of an airflow regulating device is disposed at a closed position, and first and second hook elements are disposed at engaging positions.
Figure 28:
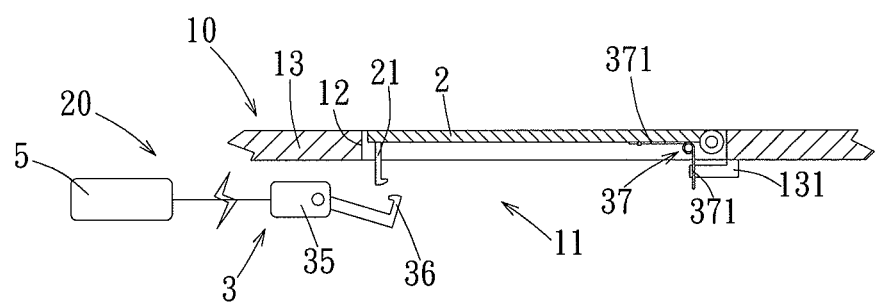
FIG. 28 is a fragmentary sectional view of the ninth embodiment, illustrating a state in which the cover panel of the airflow regulating device is disposed at the closed position, the first hook element is disposed at the engaging position, and the second hook element is disposed at a disengaging position.
Figure 29:
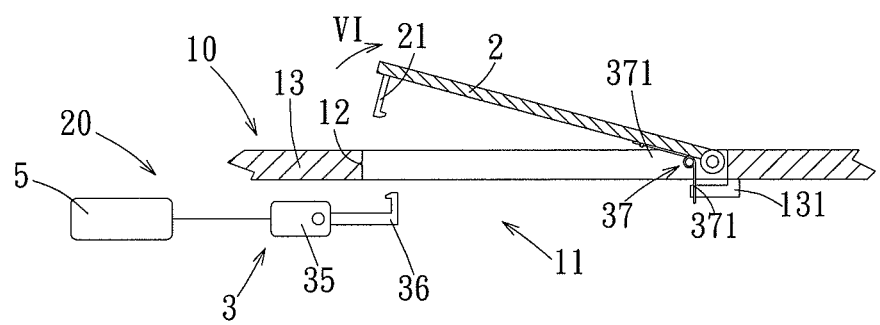
FIG. 29 is a fragmentary sectional view of the ninth embodiment, illustrating a state in which the cover panel of the airflow regulating device is disposed at an open position, the first hook element is disposed at a disengaging position, and the second hook element is disposed at the engaging position.

FIGS. 27 to 29 illustrate the ninth embodiment of the electronic apparatus 100 according to this invention. The manner in which the motor controller 5 controls the actuating switch 35 of the actuating mechanism 3 is similar to that of the second embodiment, and the connection between the cover panel 2 and the side wall 13 is similar to that of the eighth embodiment. However, the ninth embodiment uses an urging spring 37 to replace an assembly of the motor 32, the rack 34, and the pinion 33 of the actuating mechanism 3 for driving movement of the cover panel 2.

In this embodiment, the housing 10 has a spring-positioning seat 131 mounted on a periphery of the air inlet 12 at an inner side of the side wall 13. The urging spring 37 is in the form of a torsion spring having one arm 371 secured to the spring-positioning seat 131, and the other arm 371 abutting against the cover panel 2. As such, when the second hook element 36 is moved to disengage from the first hook element 21, the urging force of the urging spring 37 drives rotation of the cover panel 2 in a rotational direction (VI) from a closed position (see FIG. 28) to an open position (see FIG. 29).

Figure 30:
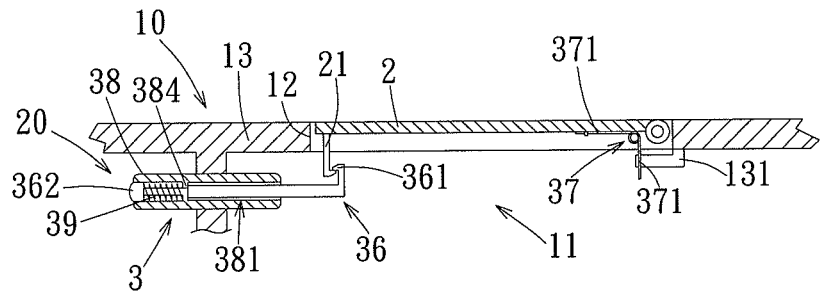
FIG. 30 is a fragmentary sectional view of the tenth embodiment of an electronic apparatus according to the invention, illustrating a state in which a cover panel of an airflow regulating device is disposed at a closed position, and first and second hook elements are disposed at engaging positions.
Figure 31:
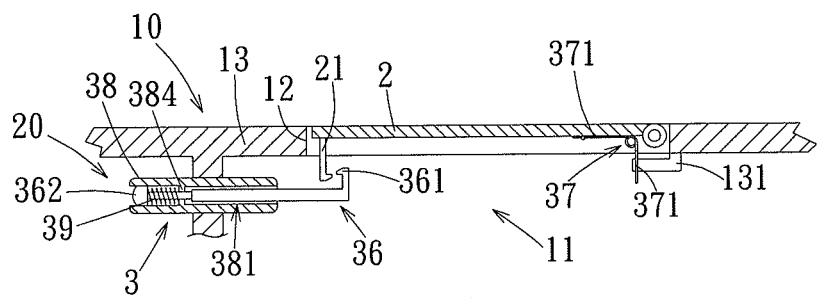
FIG. 31 is a fragmentary sectional view of the tenth embodiment, illustrating a state in which the cover panel of the airflow regulating device is disposed at the closed position, the first hook element is disposed at the engaging position, and the second hook element is disposed at a disengaging position.
Figure 32:
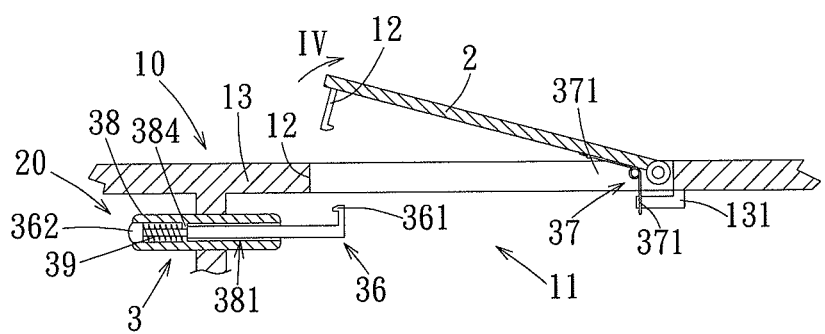
FIG. 32 is a fragmentary sectional view of the tenth embodiment, illustrating a state in which the cover panel of the airflow regulating device is disposed at an open position, the first hook element is disposed at a disengaging position, and the second hook element is disposed at the engaging position.

FIGS. 30 to 32 illustrate the tenth embodiment of the electronic apparatus 100 according to this invention. The manner in which the second hook element 36 of the actuating mechanism 3 operates is similar to that of the third embodiment, and the connection between the cover panel 2 and the side wall 13 is similar to that of the ninth embodiment. In operation, when the pressing end 362 of the second hook element 36 is operated such that the hook end 361 is disengaged from the first hook element 21, the urging force of the urging spring 37 urges the cover panel 2 to rotate in a rotational direction (VI) from a closed position (see FIG. 31) to an open position (see FIG. 32).

Figure 33:
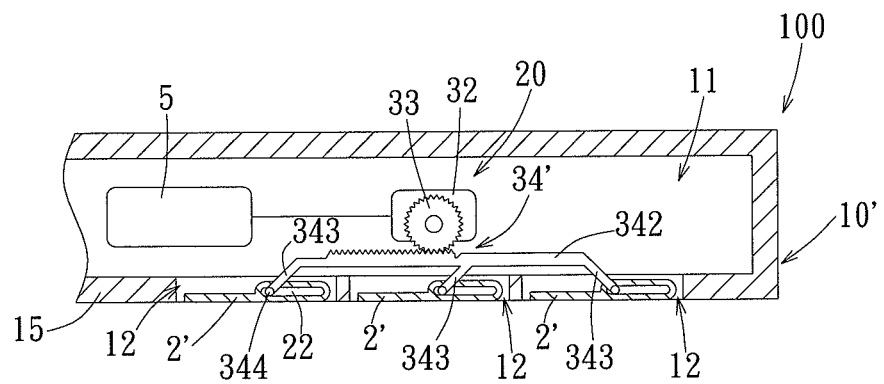
FIG. 33 is a fragmentary sectional view of the eleventh embodiment of an electronic apparatus according to the invention, illustrating a state in which cover panels of an airflow regulating device are disposed at a closed position.

FIG. 33 illustrates the eleventh embodiment of the electronic apparatus 100 according to this invention. In this embodiment, the electronic apparatus 100 is a notebook computer. The eleventh embodiment differs from the previous embodiments in structural design and operation.

Figure 34:
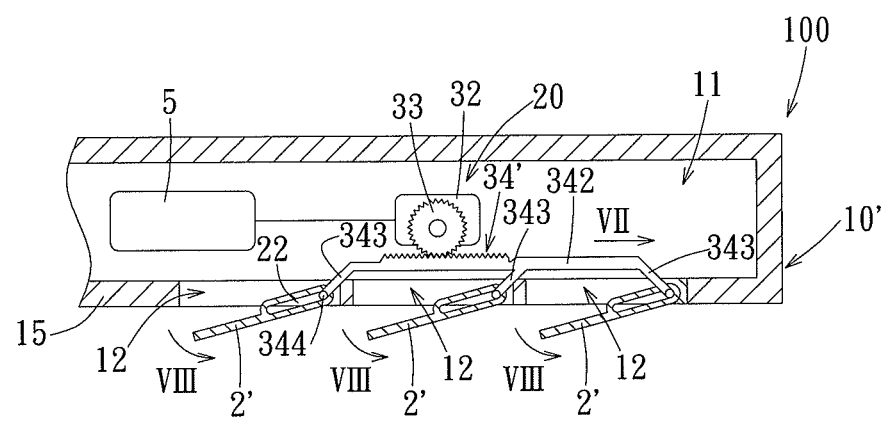
FIG. 34 is a fragmentary sectional view of the eleventh embodiment, illustrating a state in which the cover panels of the airflow regulating device are disposed at an open position.

In this embodiment, the housing 10' includes a bottom wall 15 formed with three air inlets 12 spaced apart from one another. The airflow regulating device 20 includes three cover panels 2' for covering the air inlets 12, respectively. Each of the cover panels 2' is formed with an elongate hole 22. The rack 34' has a toothed portion 342, and three arm portions 343 spaced apart from each other and extending from the toothed portion 342. Each of the arm portions 343 has a tongue 344 at an end thereof extending into and slidable along the elongate hole 22 in a respective one of the cover panels 2'. In operation, when one of the driving voltage values generated by the temperature-controlling circuit 8 (see FIG. 3) corresponds to a preset value established in the motor controller 5, the motor controller 5 generates a control signal to actuate the motor 32 to drive movement of the rack 34' along a direction (VII) and to cause sliding movement of the tongue 344 of each of the arm portions 343 from the left to the right of the respective elongate hole 22, which, in turn, results in rotation of the respective cover panel 2' in a rotational direction (VIII) from the closed position to the open position as shown in FIG. 34. It is to be noted that the number of the air inlets 12 and the number of the cover panels 2' are not limited to what are disclosed hereinabove, and can be varied as needed.

Figure 35:
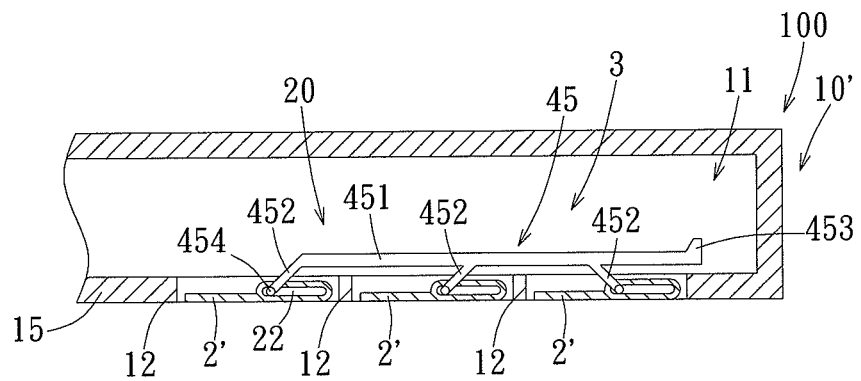
FIG. 35 is a fragmentary sectional view of the twelfth embodiment of an electronic apparatus according to the invention, illustrating a state in which cover panels of an airflow regulating device are disposed at a closed position.

FIG. 35 illustrates the twelfth embodiment of the electronic apparatus 100 according to this invention. The structure of this embodiment is similar to that of the eleventh embodiment. However, the operation of the actuating mechanism 3 in this embodiment is different from that of the eleventh embodiment.

Figure 36:
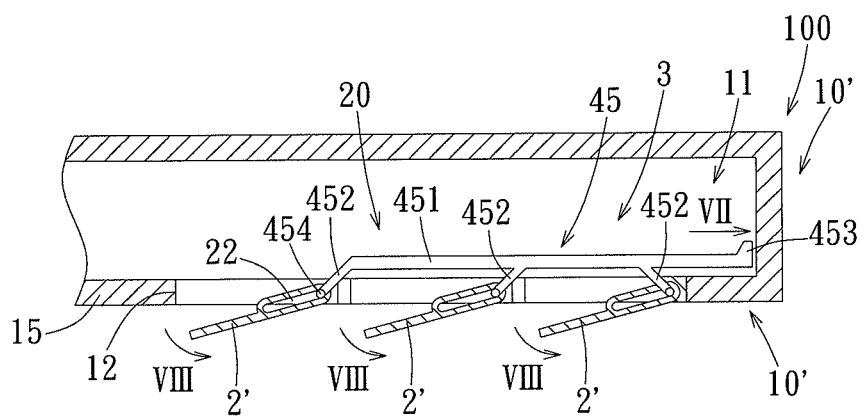
FIG. 36 is a fragmentary sectional view of the eleventh embodiment, illustrating a state in which the cover panels of the airflow regulating device are disposed at an open position.

The actuating mechanism 3 includes an operating rod 45 mounted in the housing 10'. The operating rod 45 includes main body 451, and three arm portions 452 extending in a slanted configuration from the main body 452. An operating portion 453 is formed on the main body 451 that protrudes from the housing 10'. Each of the arm portions 452 has a tongue 454 at an end thereof extending into and slidable along the elongate hole 22 in a respective one of the cover panels 2'. When the user pulls on the operating portion 453 in a rightward direction, i.e., the direction (VII), the tongue 454 of each of the arm portions 452 slides from the left to the right of the respective elongate hole 22. When the tongue 454 of each of the arm portions 452 slides to the furthermost rightward end of the respective elongate hole 22, the respective cover panel 2' is rotated in the rotational direction (VIII) from the closed position shown in FIG. 35 to the open position as shown in FIG. 36.

In the foregoing embodiments, with the inclusion of the airflow regulating device 20 in the electronic apparatus 100, the amount of air inflow into the accommodating space 11 can be increased so as to enhance the heat-dissipating efficiency of the cooling fan 9. As a result, crashing and other problems due to poor heat dissipation may be avoided. Moreover, by realizing effective heat dissipation through the simple structural design of the airflow regulating device 20, the use of a heat-dissipating module that is high in cost and complicated in structure is unneeded, and manufacturing costs are reduced.

While the invention has been described in connection with what are considered the most practical and embodiments, it is understood that this invention is not limited to the disclosed embodiments but is intended to cover various arrangements included within the spirit and scope of the broadest interpretation so as to encompass all such modifications and equivalent arrangements.

What is claimed is:

1. An electronic apparatus comprising:
    a housing defining an accommodating space therein, and an air inlet that places said accommodating space in fluid communication with the external environment; and
    an airflow regulating device including a cover panel for covering and uncovering said air inlet, and an actuating mechanism coupled to said cover panel and driving movement of said cover panel to adjust the degree of opening of said air inlet in response to a change in temperature in said accommodating space;
    wherein said cover panel is pivotably connected to said housing and is provided with a first hook element, said actuating mechanism including a second hook element mounted on said housing and engaging releasably said first hook element, and an urging spring for urging said cover panel to move relative to said air inlet from the closed position to an open position, said second hook element being pressable to move in a direction to disengage said first hook element.

2. The electronic apparatus as claimed in claim 1, wherein said actuating mechanism further includes a mounting seat mounted on said housing and formed with a retaining hole, and a biasing spring received in said retaining hole, said second hook element extending into and through said retaining hole and having a hook end that engages releasably said first hook element, and a pressing end that is disposed opposite to said hook end, said biasing spring biasing said second hook element for restoring said second hook element to its original position.

3. The electronic apparatus as claimed in claim 1, wherein said housing has a side wall that is formed with said air inlet, and a supporting bracket mounted at an inner side of said side wall, said supporting bracket being formed with an elongate guiding groove, said actuating mechanism further including a pair of linkages that cross and that are pivoted to each other, each of said linkages having a pivot end pivoted to said cover panel, and an insert end opposite to said pivot end and received slidably in said guiding groove, said actuating mechanism further including a pair of torsion springs, each of which abuts against said linkages in such a manner to drive sliding movement of said insert ends of said linkages toward each other in said guiding groove.

* * * * *